United States Patent
Andler et al.

(10) Patent No.: US 6,263,575 B1
(45) Date of Patent: Jul. 24, 2001

(54) PLAIN BEARING AND METHOD FOR THE PRODUCTION THEREOF

(75) Inventors: Gerd Andler, Frankfurt; Jens-Peter Heinss; Klaus Goedicke, both of Dresden; Christoph Metzner, Pappritz, all of (DE)

(73) Assignee: Federal-Mogul Wiesbaden GmbH & Co. KG, Wiesbaden (DE)

(*) Notice: Subject to any disclaimer, the term of this patent is extended or adjusted under 35 U.S.C. 154(b) by 0 days.

(21) Appl. No.: 09/584,515

(22) Filed: May 31, 2000

Related U.S. Application Data

(62) Division of application No. 09/322,584, filed on May 28, 1999, now Pat. No. 6,146,019.

(30) Foreign Application Priority Data

Jun. 2, 1998 (DE) ............................................. 198 24 310

(51) Int. Cl.[7] ............................................. B21D 53/10
(52) U.S. Cl. ............................ 29/898.042; 29/898.12
(58) Field of Search ..................... 29/898.042, 898.12, 29/898.13; 384/276, 288, 294, 625, 912, 913; 427/569, 576, 585

(56) References Cited

U.S. PATENT DOCUMENTS

| | | | |
|---|---|---|---|
| 4,889,772 | * 12/1989 | Bergmann et al. | 428/547 |
| 4,996,025 | * 2/1991 | Pratt et al. | 420/554 |
| 5,053,286 | * 10/1991 | Pratt et al. | 428/653 |
| 5,137,792 | * 8/1992 | Hodes et al. | 428/614 |
| 5,897,968 | * 4/1999 | Dosaka et al. | 428/687 |
| 5,955,202 | * 9/1999 | Steeg et al. | 428/457 |
| 6,012,850 | * 1/2000 | Kagohara et al. | 384/276 |

* cited by examiner

Primary Examiner—S. Thomas Hughes
Assistant Examiner—Marc W. Butler
(74) Attorney, Agent, or Firm—Reising, Ethington, Barnes, Kisselle, Learman & McCulloch, PC

(57) ABSTRACT

A plain bearing overlay (3) of which exhibits properties which are markedly improved with regard to wear resistance in comparison with overlays applied by electroplating and conventional electron beam vapor deposition methods. The surface of the overlay (3) comprises round raised portions (4) and depressed portions (6), wherein, in relation to the horizontal section plane (7), the raised portions (4) cover a proportion of the surface area amounting to 30% to 50%, based on the entire surface area of the plain bearing, the section plane (7) being at a height at which the total proportion of the surface area consisting of the raised portions (4), and obtained in vertical section, is equal to the total corresponding proportion consisting of the depressed portions (6). The round raised portions exhibit a diameter D of 3 to 8 $\mu$m, in plan view, wherein, in the case of raised portions (4) and depressed portions (6) which in plan view are not circular, this value relates to the maximum diameter. The surface exhibits a roughness of $R_z$=3 to 7 $\mu$m. The method of producing such plain bearings is based on electron beam vapor deposition, wherein a backing member with a roughness of $R_z$ 2 $\mu$m is used and vapor deposition of the overlay is effected at a pressure <0.1 Pa.

1 Claim, 3 Drawing Sheets

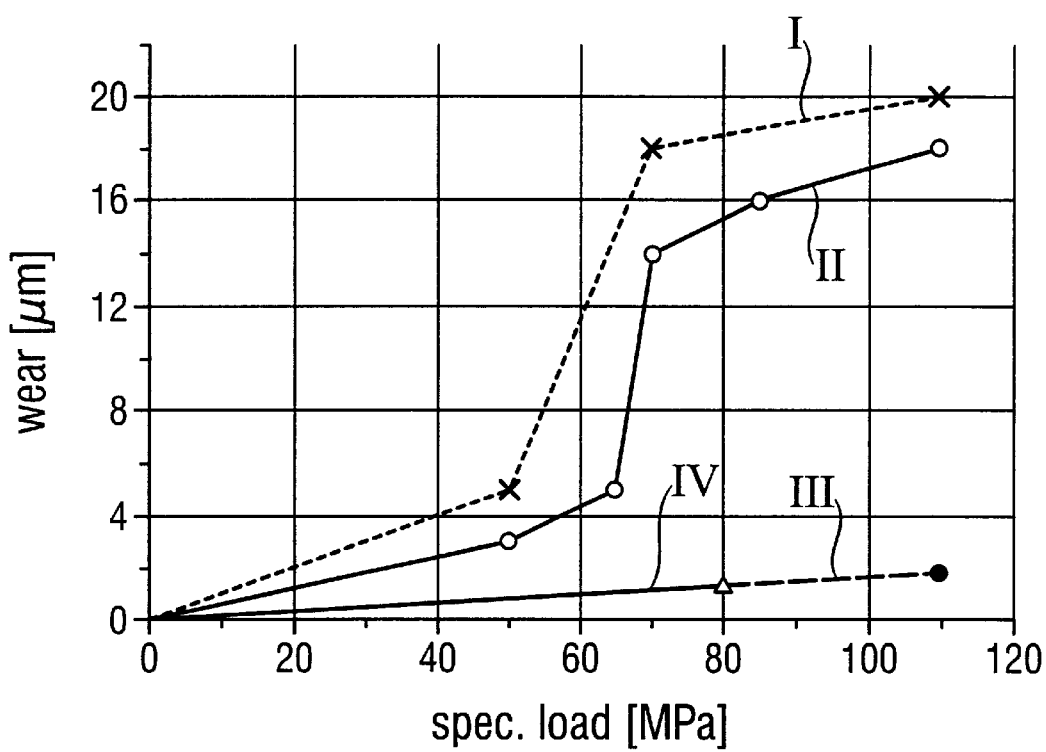

PLAIN BEARING AND METHOD FOR THE PRODUCTION THEREOF

Figure 1:
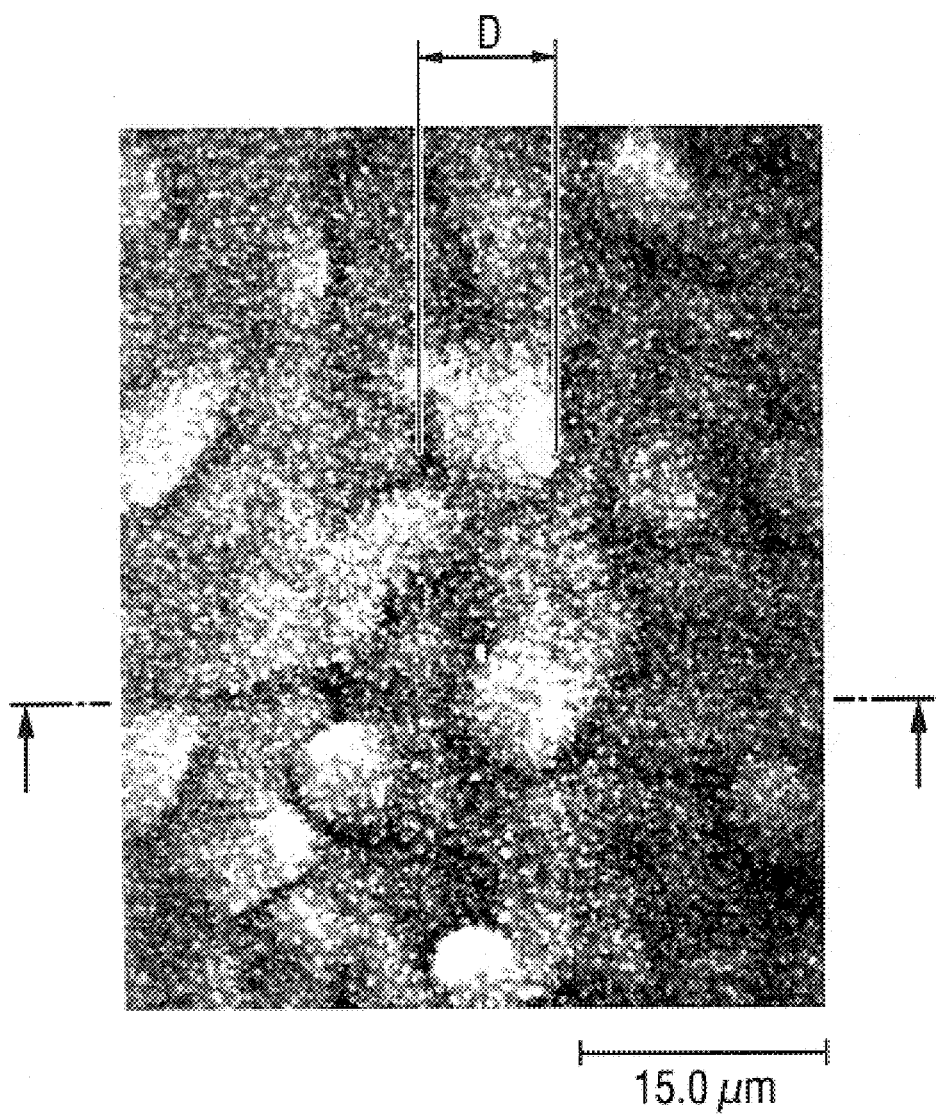

This application is a divisional of application Ser. No. 09/322,584, filed May 28, 1999, now U.S. Pat. No. 6,146,019.

BACKGROUND OF THE INVENTION

1. Technical Field

The invention relates to a plain bearing, comprising a backing member and at least one metallic overlay, which is applied by means of electron beam vapour deposition. The invention also relates to a method of producing a plain bearing having such an overlay according to the precharacterising clause of claim 4.

2. Related Prior Art

Examples of plain bearings are radial bearings, axial bearings and axial/radial bearings, the functional area being present in flat or curved form and coating being effected in the finished state or during an intermediate stage, such as at the semifinished product stage for instance (strips or strip portions of flat form).

In general, plain bearings used for such purposes comprise multilayer composite systems of the following construction: steel support member serving as backing material, bearing metal layer of a Cu, Al or white metal alloy and a so-called sliding or third layer or overlay, which may be applied either by an electroplating process (E. Römer: Three-component bearings of GLYCO 40; GLYCO Engineering Report 8/67) or by a cathodic sputtering process as described in EP 0 256 226 B1. Layers applied by electroplating, which are generally based on Pb or Sn, exhibit the disadvantages of frequently inadequate corrosion resistance and low wear resistance. Furthermore, the electroplating process is in itself dubious from the environmental point of the view.

Where overlays are applied by the sputtering method, a considerable cost factor is introduced with respect to the complete plain bearing, owing to the low deposition rates achievable therewith and the high technical complexity of the equipment needed.

Moreover, it is known from DE 43 90 686 T1 that these overlays with special surface structures (pyramid-shaped crystal grains on the surface of the Pb layer deposited by electroplating) exhibit excellent blocking and fatigue strength. This situation may be put down to good oil retention and to the dispersion and reduction of a concentratedly applied load by the pyramid-shaped crystal grains of the surface. Disadvantages of this method are that once again an electroplating process is used, with all the attendant shortcomings, and the process for producing this special surface structure is very expensive, since it is a multistage process with additional heat treatment. Furthermore, the surface layer consists of a lead alloy of questionable toxicity.

DE 196 08 028 A1 likewise describes a special sliding surface structure, which has a positive effect on sliding properties. The corrosion sensitivity of the surface is countered on the one hand by hexagonal pyramid-shaped metal crystals in the surface or by the inclusion of oxygen, phosphorus etc in the sides of the pyramids (hardening effect). This method is used exclusively for iron-based alloys, the specially structured sliding surface consisting of Fe crystals. A typical application is the coating of piston pins. Their tribological properties render such alloys unsuitable for use for plain bearings.

It is also known from DE 195 14 835 A1 and 195 14 836 A1 to deposit overlays on concavely curved plain bearings by means of electron beam vapour deposition. Using this method it is possible, by adjusting certain method parameters, to produce specific layer thickness profiles over the circumference of the plain bearing. No reference is made in these documents to a special surface topography which may be produced using this method. However, for a plurality of applications the tribological properties achievable therewith are inadequate.

A method is known from DE 36 06 529 A1 for producing multilayer materials or multilayer workpieces by the vapour deposition of at least one metallic material onto a metallic substrate, an electron beam vapour deposition process likewise being used to apply the overlay. The method is carried out in a residual gas atmosphere under pressures ranging from $10^{-2}$–$10^{-3}$, wherein the material is dispersion-hardened or dispersion-strengthened simultaneously with the vapour deposition. Coating rates are set at approximately 0.3 $\mu$m/s. During vapour deposition, the substrate is kept at a temperature between 200° C. and 800° C. The temperature of the substrate is 200° C. to 300° C. for vapour deposition of aluminium alloys and in the range of from 500° C. to 700° C. for vapour deposition of copper-lead alloys. No mention is made of the topography of the overlays produced using this method. The load-carrying capacity of the layers produced according to this method is markedly better than that of layers produced by powder-metallurgical methods. In many instances of application, plain bearings produced according to this method do not exhibit satisfactory wear resistance. A priority of this application is to produce a defined hard phase content in the overlay by dispersion strengthening, e.g. by producing oxides during vapour deposition. Optimisation of the surface shape is not mentioned.

SUMMARY OF THE INVENTION

The object of the invention is to provide a plain bearing, the overlay of which exhibits properties which are markedly improved with regard to wear resistance in comparison with overlays applied by electroplating and conventional electron beam vapour deposition methods. It is also the object of the invention to provide a method for producing such plain bearings which is simple, economic and environmentally friendly.

The plain bearing is characterized in that the surface of the overlay comprises round raised and depressed portions, wherein, in relation to the horizontal section plane A, the raised portions cover a proportion of the surface area amounting to 30–50%, based on the entire surface area of the plain bearing, the section plane being at a height at which the total proportion of the surface area consisting of the raised portions, and obtained in vertical section, is equal to the total corresponding proportion consisting of the depressed portions, in that the round raised portions exhibit a diameter D of 3–8 $\mu$m, in plan view, wherein, in the case of raised and depressed portions which in plan view are not circular, this value relates to the maximum diameter, and in that the surface exhibits a roughness of $R_z$=3–7 $\mu$m.

The raised portions are advantageously of circular to oval structure. The term "round" refers not only to the shape of the raised and depressed portions in plan view but also to the vertical cross section of the raised and depressed portions.

It has emerged that raised portions which are round from the start exhibit the advantage over the known pyramid-shaped pointed raised portions that the running-in process proceeds more gently for the sliding counterparts. A reason of this is that the specific load is less for round raised portions than pointed pyramid-shaped raised portions, because a larger proportion of the surface area of round raised portions is load-bearing. Round raised portions are far less easily abraded than is the case for pointed raised portions, the consequence of this being that the depth of the indentations reduces only slightly in the running-in phase and, under normal operating conditions, is maintained for longer, whereby the oil retention in the indentations is likewise ensured over a longer period. These positive effects contribute considerably to the improved wear behaviour.

Further advantages of this topography consist in the fact that, where the plain bearing is operated in an area of mixed friction (solid/solid contact), losses in frictional performance are reduced in that only the raised areas, and not the whole bearing surface, are in solid contact. This advantage is supported by the fact that the proportion of the surface area consisting of round raised portions amounts to only 30–50%.

The backing member to which the overlay is applied advantageously consists of a composite material, which comprises a steel backing and a bearing metal alloy applied thereto by sintering, casting or plating. A diffusion barrier layer may optionally also be provided.

The overlay may consist of a copper or aluminium alloy.

The method according to the invention is characterized in that a backing member with a roughness $R_z \leq 2$ μm is used, in that the vapour deposition is carried out at a pressure <0.1 Pa, in that the rate of vapour deposition on the plain bearing perpendicularly above the evaporation source is at least 100 nm/s and in that the temperature of the backing member to be coated is between 75% and 95% of the absolute melting point of the lowest melting point component of the overlay alloy.

It has surprisingly emerged that, with the parameters set, the topography according to the invention is obtained.

A disturbing effect arises if the temperature of the substrate is increased above the value of 95% of the lowest melting point alloy phase, because diffusion of the lowest melting point phase then increases so markedly that smoothing of the surface occurs. If the temperature lies below 75% of the lowest melting alloy phase, an undesirable columnar structure forms, which leads to a higher rate of wear because the proportion of load-bearing surface areas is markedly smaller.

The roughness of the backing material may possibly have an effect on the topography insofar as the raised portions of the backing member may form condensation points, which influence growth of the coating. The effect of the roughness of the backing member is the greater, the smaller the thickness of the overlay, the material used for the backing member also being a significant factor in this context. The surface of the backing member is preferably machined prior to application of the overlay, such that the roughness amounts to $R_z \leq 2$ μm.

However, the method for producing plain bearings is not restricted to backing members made of steel/CuPbSn composite materials. Steel/aluminium or steel/white metal composites may also be coated in the same way. Examples of suitable alloy systems which may be applied by means of electron beam vapour deposition are AlSnPb or AlSnSi and other aluminium-based alloys. Likewise, CuPb alloys are also suitable.

The method according to the invention is particular economic and simpler than sputtering processes, for instance.

THE DRAWINGS

Figure 2:
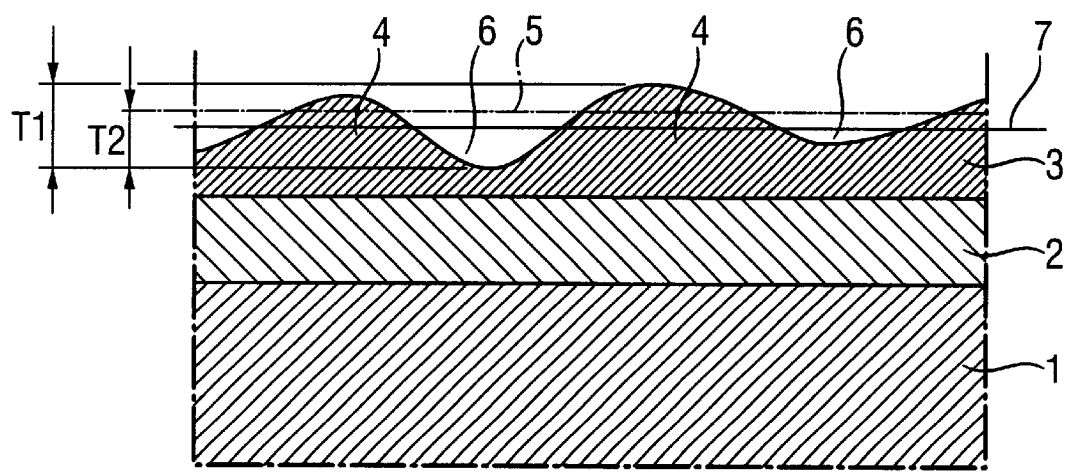

Exemplary embodiments of the invention are described in more detail below with the aid of the drawings, in which:

FIG. 1 is an electron-microscopical micrograph of an overlay applied by the method according to the invention FIG. 2 shows a section through the overlay shown in FIG. 1, the backing member also being illustrated, and FIG. 3 shows a diagram of the wear behaviour of bearing materials.

According to a preferred exemplary embodiment, a CuPbSn alloy is applied to a steel strip (carbon content between 0.03% and 0.3%) by a casting or sintering process. After various annealing and forming processes known per se, half bearings are produced from this strip by pressing strip pieces of a specific length. After surface machining of these bearings by drilling or broaching, the bearing shells are provided with a diffusion barrier layer of nickel or a nickel alloy by an electroplating or a PVD process. The backing member is then degreased and introduced into a vacuum evaporation installation. Further surface cleaning or activation is effected therein by a sputtering and etching process. The backing member is then coated by electron beam vapour deposition of AlSn20Cu from a vaporiser crucible by means of an axial electron gun. The thickness of the deposited AlSn20Cu layer is (16±4) μm.

In order to ensure that the AlSn20Cu layer adopts the above-described particularly advantageous surface topography, the following deposition parameters must be adhered to during the vapour deposition process: the pressure in the process chamber must not exceed the value of 0.1 Pa during vapour deposition; the temperature of the backing member during coating must lie between 190° C. and 200° C.; the power of the electron gun must be such that the deposition rate amounts to at least 100 nm/s. If these method parameters are adhered to, an overlay is obtained as shown by FIG. 1 in a plan view taken by scanning electron microscope.

FIG. 2 is a schematic representation of a section through the overlay 3 shown in FIG. 1, wherein the backing member with the steel backing 1 and the CuPbSn alloy 2 applied to the backing member 1 by a casting or sintering process are also shown. The section line 7 marks the position of the horizontal plane at which the sum of the vertical surface areas of the raised portions 4 lying thereabove is equal to the sum of the vertical surface areas of the indentations or depressed portions 6.

The line 5 illustrates the amount of the raised portions 4 which is abraded during the running-in process. The depth T1 of the indentations 6 reduces from the value T1 to the value T2, which, however, is still markedly greater than is achieved with overlays of pyramidal structure.

FIG. 3 shows the wear behaviour, determined on the Underwood test bench, of various bearing materials. Numbers I–IV in FIG. 3 have the following meanings:

| I | CuPbSn PbSn10Cu2 | electro-deposited |
|---|---|---|
| II | CuPbSn PbSn10Cu5 | electro-deposited |
| III | AlSn20Cu0.25 | sputtered |
| IV | AlSn20Cu0.25 | vapour deposited according to the invention. |

As FIG. 3 shows significant wear occurs with electro-deposited overlays (PbSn10Cu2 or PbSn10 Cu5) under specific loads of 50 and 65 Mpa respectively. Sputtered layers, on the other hand, exhibit linear wear over the entire load range. As FIG. 3 additionally shows, the layers vapour-deposited according to the invention are much better than the electro-deposited layers and only slightly worse than the sputtered layers as far as wear resistance is concerned, particularly under loads <50 MPa.

What is claimed is:

1. A method of producing a plain bearing comprising:

preparing a backing member having a surface roughness Rz of no more than 2 μm; and applying at least one overlay of a metallic alloy to the backing member by electron beam vapor deposition at a pressure less than 0.1 Pa, at a vapor deposition rate on the backing member perpendicularly above a deposition source of less than 100 nm/s, and while maintaining the backing member in a temperature range equal to 75% to 90% of an absolute melting point of a lowest melting point component of the metallic alloy.

* * * * *

UNITED STATES PATENT AND TRADEMARK OFFICE
CERTIFICATE OF CORRECTION

PATENT NO.     : 6,263,575 B1
DATED          : July 24, 2001
INVENTOR(S)    : Gerd Andler et al.

It is certified that error appears in the above-identified patent and that said Letters Patent is hereby corrected as shown below:

Title page,
Replace the ABSTRACT originally filed with the following:

-- ABSTRACT
A plain bearing is described, the overlay (3) of which exhibits properties which are markedly improved with regard to wear resistance in comparison with overlays applied by electroplating and conventional electron beam vapor deposition methods. The surface of the overlay (3) comprises round raised portions (4) and depressed portions (6), wherein, in relation to the horizontal section plane (7), the raised portions (4) cover a proportion of the surface area of the plain bearing, the section plane (7) being at a height at which the total proportion of the surface area consisting of the raised portions (4), and obtained in vertical section, is equal to the total corresponding proportion consisting of the depressed portions (6). The round raised portions exhibit a diameter D of 3 to 8 μm, in plain view, wherein, in the case of raised portions (4) and depressed portions (6) which in plan view are not circular, this value relates to the maximum diameter. The surface exhibits a roughness of $R_z$=3 to 7 μm. The method of producing such plain bearings is based on electron beam vapor deposition, wherein a backing member with a roughness of $R_z \leq 2$ μm is used and vapor deposition of the overlay is effected at a pressure <0.1 Pa. --

Column 1,
Bridging lines 15 and 16, cancel "according to the precharacterising clause of claim 4 --.

Column 3,
Line 26, change "$R_z \leqq 2$" to -- $R_z \leq 2$ --;

Line 54, change "$R_z \leqq 2$ μm" to -- $R_z \leq 2$ μm --.

UNITED STATES PATENT AND TRADEMARK OFFICE
CERTIFICATE OF CORRECTION

PATENT NO. : 6,263,575 B1
DATED : July 24, 2001
INVENTOR(S) : Gerd Andler et al.

It is certified that error appears in the above-identified patent and that said Letters Patent is hereby corrected as shown below:

<u>Column 4,</u>
Between lines 6 and 7, insert the following centered heading -- DETAILED DESCRIPTION --;
Line 66, change "PbSn10 Cu5" to -- PbSn10Cu5 --.

Signed and Sealed this

Sixteenth Day of April, 2002

Attest:

JAMES E. ROGAN
Director of the United States Patent and Trademark Office

Attesting Officer